United States Patent
Kwak et al.

(10) Patent No.: US 7,777,700 B2
(45) Date of Patent: Aug. 17, 2010

(54) PIXEL HAVING INTRINSIC SEMICONDUCTOR AS AN ELECTRODE AND ELECTROLUMINESCENT DISPLAYS EMPLOYING SUCH A PIXEL

(75) Inventors: Won-Kyu Kwak, Yongin-si (KR); Hye-Jin Shin, Yongin-si (KR); Hae-Jin Chun, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 699 days.

(21) Appl. No.: 11/783,710

(22) Filed: Apr. 11, 2007

(65) Prior Publication Data

US 2008/0035931 A1    Feb. 14, 2008

(30) Foreign Application Priority Data

Aug. 9, 2006    (KR)    ............... 10-2006-0075177

(51) Int. Cl.
G09G 3/30    (2006.01)
(52) U.S. Cl. .......................... 345/76; 257/72
(58) Field of Classification Search .................. 345/76, 345/82, 92; 257/72
See application file for complete search history.

(56) References Cited

U.S. PATENT DOCUMENTS

| | | | |
|---|---|---|---|
| 7,164,401 B2 | 1/2007 | Kwon | |
| 7,508,365 B2* | 3/2009 | Kim | 345/76 |
| 7,636,074 B2* | 12/2009 | Hamer et al. | 345/76 |
| 2005/0285108 A1 | 12/2005 | Choi | |
| 2006/0066527 A1* | 3/2006 | Chou | 345/76 |
| 2006/0071887 A1* | 4/2006 | Chou | 345/82 |
| 2006/0170634 A1* | 8/2006 | Kwak et al. | 345/92 |
| 2006/0290633 A1 | 12/2006 | Choi | |
| 2007/0030217 A1* | 2/2007 | Peng | 345/76 |

FOREIGN PATENT DOCUMENTS

| | | |
|---|---|---|
| CN | 1 534 578 A | 10/2004 |
| JP | 08-213627 A | 8/1996 |
| JP | 11-135796 A | 5/1999 |
| JP | 2002-023197 A | 1/2002 |
| KR | 10-2006-0087885 A | 8/2006 |
| KR | 10-0624314 B1 | 9/2006 |
| KR | 10-0674243 B1 | 1/2007 |

* cited by examiner

Primary Examiner—Amare Mengistu
Assistant Examiner—Yuk Chow
(74) Attorney, Agent, or Firm—Lee & Morse, P.C.

(57) ABSTRACT

A pixel employable by a display device, including a plurality of transistors, including a first transistor having a gate electrode, and a capacitor including a first terminal connected to the gate electrode of the first transistor and a second terminal that is an intrinsic semiconductor.

19 Claims, 5 Drawing Sheets

TFT region

FIG. 10

TFT region

PIXEL HAVING INTRINSIC SEMICONDUCTOR AS AN ELECTRODE AND ELECTROLUMINESCENT DISPLAYS EMPLOYING SUCH A PIXEL

BACKGROUND OF THE INVENTION

1. Field of the Invention

The present invention relates to a pixel of an electroluminescent display and a capacitive element in a pixel. More particularly, the present invention relates to an organic light emitting diode (OLED) display capable of being manufactured at a reduced manufacturing cost by reducing additional doping processes and/or mask processes during formation of a pixel and a capacitive element thereof.

2. Description of the Related Art

Much progress has been made for developing large screen displays and/or flat panel displays that have large screens and/or consume relatively small amounts of power. For example, liquid crystal displays (LCDs), plasma display panels (PDPs), and OLED displays have been introduced. Flat panel display devices using electroluminescent material, e.g., organic electroluminescent material, may be manufactured to be lighter, lower in volume, thinner and/or with improved color reproduce-ability, as compared to conventional displays. More particularly, e.g., organic electroluminescent displays may provide advantages such as faster response speeds than LCDs, superior luminance due to being self emission type, relatively simple structure, relatively easy manufacturing process, relatively thin size and/or relatively low weight. Therefore, organic electro-luminescence displays can be used in various fields such as backlight devices, portable terminals, GPS systems, laptop computers, and large screen TVs.

As progress is being made with regard to such flat panel displays, and, more particularly, e.g., electroluminescent displays, devices that may be manufactured at a lower cost and/or by an easier manufacturing process are desired. For example, conventional pixels employ complementary-metal-oxide-semiconductor (CMOS) processing and thus, employ both P-type and N-type impurities. Therefore, separate masks may be required for forming the N-type and the P-type impurity regions, which may thereby result in an increased number of masks, increased manufacturing cost and/or processing time. Pixels and capacitive elements that may be manufactured, e.g., at a reduced cost and/or using a simplified manufacturing process are desired.

The above information disclosed in this Background section is only for enhancing understanding of the background of the invention and, therefore, may contain information that does not form prior art that is already known in this country to a person of ordinary skill in the art.

SUMMARY OF THE INVENTION

The present invention is therefore directed to a pixel and electroluminescent displays employing such a pixel, which substantially overcome one or more of the problems due to the limitations and disadvantages of the related art.

It is therefore a feature of an embodiment of the present invention to provide an organic light emitting diode display capable of being manufactured with a reduced number of processing steps and/or a reduced number of masks.

At least one of the above and other features and advantages of the present invention may be realized by providing a pixel of a display device connected to a data line for supplying a data voltage to the pixel, a scan line for supplying a scan voltage to the pixel, a first power supply for supplying a first supply voltage to the pixel, a second power supply for supplying a second supply voltage to the pixel, and an initial voltage supply for supplying an initial voltage to the pixel, the pixel including a first transistor for supplying a current to a light emitting device, a second transistor for diode-connecting the first transistor, a third transistor having a first electrode connected to the data line and a second electrode connected to a first electrode of the first transistor, a first capacitive element electrically connected to the first power supply and the initial voltage supply and including a first electrode that is an intrinsic semiconductor, a fourth transistor having a first electrode electrically connected to the first capacitive element and a second electrode electrically connected to the initial voltage supply, a fifth transistor having a first electrode connected to the first power supply and a second electrode electrically connected to a first electrode of the second transistor, a sixth transistor having a first electrode electrically connected to the first electrode of the first transistor and a second electrode electrically connected to the first electrode of the light emitting device, and a second capacitive element electrically connected to a gate electrode of the third transistor and a gate electrode of the first transistor.

The light emitting device may be a light emitting diode. The light emitting device may be an organic light emitting diode. The intrinsic semiconductor may be an intrinsic polycrystalline semiconductor. The first transistor may be a driving transistor. The first transistor may be a P channel type transistor, and may include a P-type semiconductor. Impurities of the P-type semiconductor may include at least one of antimony Sb, phosphorus P and arsenic As.

A gate electrode of the sixth transistor may be connected to an emission control line of the display. A gate electrode of the fifth transistor may be connected to the emission control line, and may apply the first supply voltage to a second electrode of the first transistor in response to a signal of the emission control line.

The third transistor may be a switching transistor and may transfer the data voltage to the first electrode of the first transistor in response to the scan voltage. The second transistor may be turned on in response to the scan voltage and when the second transistor is turned on, the first transistor may be diode-connected.

The scan voltage may be applied to a gate electrode of the fourth transistor, and the fourth transistor may apply the initial voltage to the first capacitive element in response to the scan voltage.

The first electrode of the first capacitive element may be a polycrystalline semiconductor crystallized by an excimer laser annealing (ELA) technique. The first electrode of the first capacitive element may be a polycrystalline semiconductor crystallized by a solid phase crystallization (SPC) technique. The first electrode of the first capacitive element may be a polycrystalline semiconductor crystallized by a metal induced crystallization (MIC) technique. The first electrode of the first capacitive element may be a polycrystalline semiconductor crystallized by a metal induced lateral crystallization (MILC) technique. The first electrode of the first capacitive element may be a polycrystalline semiconductor crystallized by a metal induced crystallization through a cap (MICC) technique.

At least one of the above and other features and advantages of the present invention may be realized by providing an electroluminescent display including a first substrate and a second substrate spaced apart from the first substrate, wherein between the first substrate and the second substrate, the electroluminescent display including a data line for applying a data voltage, a scan line for applying a scan voltage, a first power supply for supplying a first voltage, a second power supply for supplying a second voltage, an initial voltage supply for supplying an initial voltage, a first transistor for supplying a current to an electroluminescent device, a second transistor for diode-connecting the first transistor, a third transistor having a first electrode connected to the data line and a second electrode connected to a first electrode of the first transistor, a first capacitive element electrically connected to the first power voltage supply and the initial voltage supply and including a first electrode that is an intrinsic semiconductor, a fourth transistor having a first electrode electrically connected to the first capacitive element and a second electrode electrically connected to the initial voltage supply, a fifth transistor having a first electrode connected to the first power supply and a second electrode electrically connected to a first electrode of the second transistor, a sixth transistor having a first electrode electrically connected to the first electrode of the first transistor and a second electrode electrically connected to the first electrode of the electroluminescent device, and a second capacitive element electrically connected to a gate electrode of the third transistor and a gate electrode of the first transistor, wherein the space between the first substrate and the second substrate is sealed with at least one of a sealant including elastic material and a frit having silicon oxide ($SiO_2$).

The electroluminescent device may be an organic light emitting diode.

At least one of the above and other features and advantages of the present invention may be realized by providing a pixel employable by a display device, the pixel including a plurality of transistors, including a first transistor having a gate electrode, and a capacitor including a first terminal connected to the gate electrode of the first transistor and a second terminal that is an intrinsic semiconductor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE EMBODIMENTS

Korean Patent Application No. 10-2006-0075177 filed on Aug. 9, 2006, in the Korean Intellectual Property Office and entitled: "Organic Light Emitting Diode Display," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening elements or layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

When an element is referred to as being "connected" to a second element, it could mean that the first element is directly connected to the second element, or it could also mean that the first element and the second element are "electrically connected" having one or more elements between them. Furthermore, when an element is referred to as "including" a constituent element, unless specified otherwise, it does not mean that the element excludes any other constituent element(s), but rather means that the element may or may not include other constituent elements. Like reference numerals refer to like elements throughout the specification.

It is an object of the present invention to provide a pixel circuit and an OLED display using the same that can reduce the manufacturing cost and time by providing a structure having a capacitive element of a pixel of a display, e.g., OLED display, that employs an intrinsic semiconductor at one end thereof to reduce a number of masks and/or simplify the manufacturing process.

Exemplary embodiments of the present invention will now be described with reference to the accompanying drawings.

Figure 1:
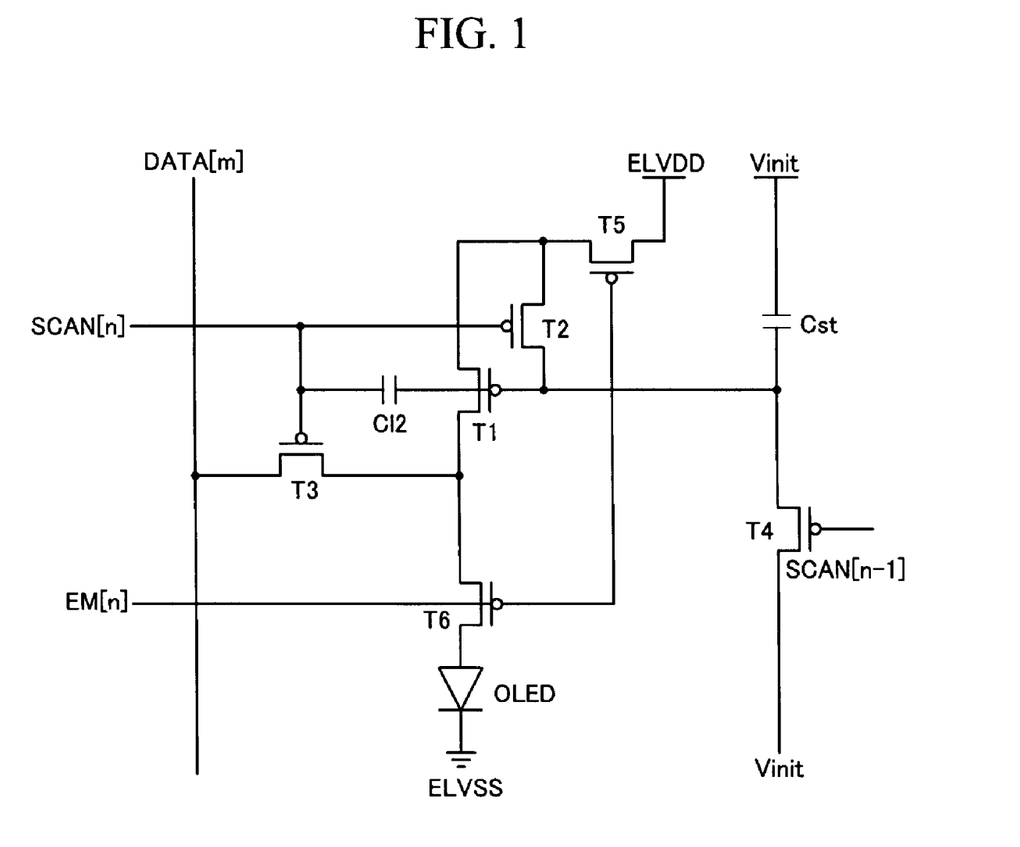
FIG. 1 illustrates a circuit diagram of a pixel for an OLED display according to an exemplary embodiment of the present invention.

FIG. 1 illustrates a circuit diagram of a pixel for an OLED display, as an exemplary electroluminescent display, according to an exemplary embodiment of the present invention.

As shown in FIG. 1, the exemplary pixel for the OLED display according to an exemplary embodiment of the present invention may be connected to a data line DATA[m] for applying data signals, a plurality of scan lines SCAN[n−1], SCAN[n] crossing the data line DATA[m] for applying scan signals, and an emission control line EM[n]. More particularly, e.g., the pixel may be connected to a respective one of the scan lines SCAN[n] corresponding to the pixel and a previous one of the scan lines SCAN[n−1] corresponding to a previous pixel driven before the pixel currently being driven. The pixel may include a first transistor T1, a second transistor T2, a third transistor T3, a fourth transistor T4, a fifth transistor T5, a sixth transistor T6, a first capacitive element Cst, a second capacitive element Cl2. The pixel may include an organic light emitting diode (OLED).

A gate electrode of the first transistor T1 may be electrically connected to a first terminal of the first capacitive element Cst and a first terminal of the second capacitive element Cl2, a source electrode of the first transistor T1 may be electrically connected to a drain electrode of the second transistor T2 and a drain electrode of the fifth transistor T5, and a drain electrode of the first transistor T1 may be electrically connected to a source electrode of the sixth transistor T6 and a drain electrode of the third transistor T3. A gate electrode of the second transistor T2 may be electrically connected to the scan line SCAN[n], and a source electrode of the second transistor T2 may be electrically connected to the gate electrode of the first transistor T1.

A gate electrode of the third transistor T3 may be connected to the scan line SCAN[n], and a source electrode of the third transistor T3 may be electrically connected to the data line DATA[m]. A source electrode of the fourth transistor T4 may be connected to the first terminal of the first capacitive element Cst, a drain electrode of the fourth transistor T4 may be connected to an initial voltage Vinit line, and a gate electrode of the fourth transistor T4 may be connected to the previously driven scan line SCAN[n−1].

A gate electrode of the fifth transistor T5 may be connected to the emission control line EM[n], and a source electrode of the fifth transistor T5 may be connected to the first power source ELVDD voltage. A gate electrode of the sixth transistor T6 may be electrically connected to the emission control line EM[n], and a drain electrode of the sixth transistor T6 may be electrically connected to an anode of the OLED. A cathode of the OLED may be connected to the second power source ELVSS.

A second terminal of the first capacitive element Cst may be connected to the initial voltage Vinit line. A second terminal of the second capacitive element Cl2 may be connected to the scan line SCAN[n], the gate electrode of the second transistor T2 and the gate electrode of the third transistor T3.

The first transistor T1 may be a driving transistor for converting a voltage applied between the gate and source electrodes thereof into a current. The second transistor T2 may be a diode-connecting transistor for diode-connecting the first transistor T1. The third transistor T3 may be a switching transistor for applying a data voltage applied to the data line DATA[m] to the first transistor T1 in response to a scan signal applied to the scan line SCAN[n].

The fourth transistor T4 may be a switching transistor for applying an initial voltage applied to the initial voltage Vinit line to the first capacitive element Cst. The fifth transistor T5 may be a switching transistor for applying the first power source ELVDD voltage to the source electrode of the first transistor T1.

The sixth transistor T6 may be a switching transistor for selectively blocking a current from the first transistor T1 to the OLED in response to an emission control signal applied to the emission control line EM[n].

The first capacitive element Cst may play a role in reducing/preventing a data voltage applied between the gate and source electrodes of the first transistor T1 from dropping. The second capacitive element Cl2 may be a capacitor for storing a threshold voltage of the first transistor T1 and/or compensating for a drift according to the threshold voltage of the first transistor T1.

Figure 2:
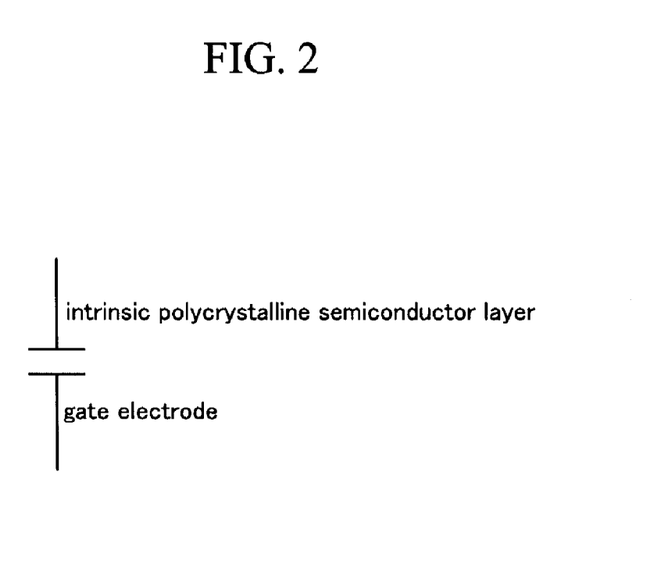
FIG. 2 illustrates a schematic diagram of an exemplary first capacitive element of a pixel according to one or more aspects of the present invention.

FIG. 2 illustrates a schematic diagram of an exemplary first capacitive element of a pixel according to one or more aspects of the present invention. As shown in FIG. 2, in some embodiments of the invention, a first terminal of the first capacitive element Cst may be an intrinsic polycrystalline semiconductor and/or a second terminal of the first capacitive element Cst may be a gate electrode.

In some embodiments of the invention, the intrinsic polycrystalline semiconductor layer may be made, e.g., by crystallizing amorphous semiconductor into a polysilicon layer through laser annealing, solid phase crystallization, or metal induced crystallization (MIC).

Figure 3:
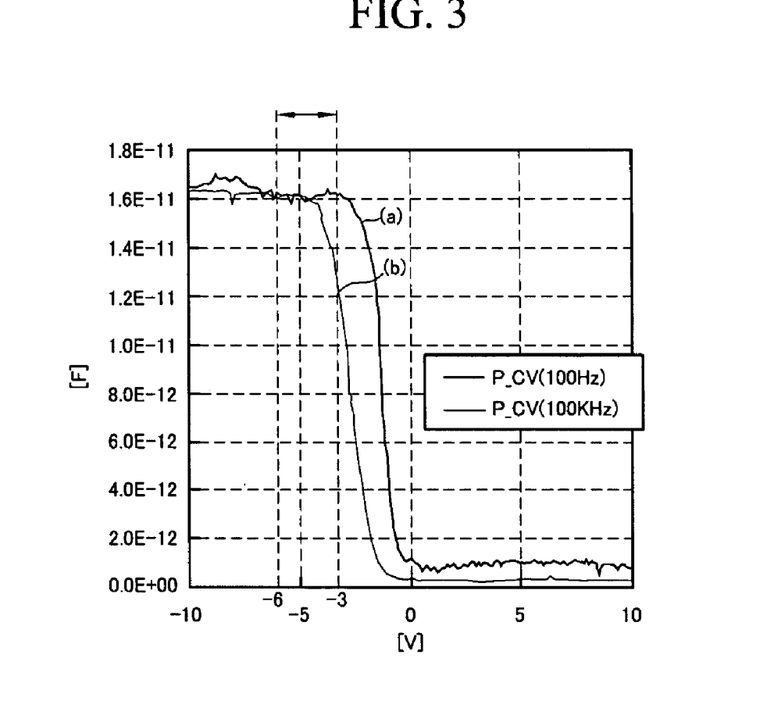
FIG. 3 illustrates a graph of a relationship between a frequency of an alternating voltage applied to an exemplary capacitor employing one or more aspects of the invention and an amount of voltage stored in the capacitor.

FIG. 3 illustrates a graph of a capacitance-voltage (C-V) curve corresponding to relationship between a frequency of an alternating voltage applied to a capacitor having an intrinsic polycrystalline semiconductor as one electrode thereof and an amount of voltage across terminals of the capacitor. A driving range of a pixel employing a capacitor according to one or more aspects of the invention may be determined according to a substantially stable region of the C-V curve of the capacitor over a range of frequencies.

Referring to FIG. 3, curve (a) corresponds to a case in which a frequency of an alternating voltage applied to the capacitor is 100 Hz, and curve (b) corresponds to a case in which the frequency is 100 KHz. As shown in FIG. 3, a driving range of a pixel of a display, e.g., an OLED display, including the first capacitive element Cst employing an intrinsic polycrystalline semiconductor layer at one terminal thereof may be about −3V to about −6V, i.e., a substantially stable region for curves (a) and (b). In the exemplary embodiment shown in FIG. 3, when the frequency range of an alternating voltage input into the capacitor is from about 100 Hz to about 100 KHz, the voltage across the capacitor may range from about −3V to about −6V.

In embodiments of the invention, an intrinsic polycrystalline semiconductor capacitive element can be employed in a pixel of a display, e.g., an OLED display, by setting a driving range of the pixel to a predetermined range so as to correspond to a stable capacitance region in a C-V curve of the capacitor having intrinsic polycrystalline semiconductor as one electrode thereof.

Embodiments of the invention may provide a pixel including a capacitor that has an intrinsic polycrystalline semiconductor as one electrode thereof. Embodiments of the invention may provide a simplified and/or lower cost process for manufacturing a pixel by including a capacitor that has an intrinsic polycrystalline semiconductor as one electrode thereof and thus, may be manufactured using a fewer number of masks and/or processing steps as compared to conventional pixels.

An exemplary method of forming an intrinsic polycrystalline semiconductor layer will be described below.

In some embodiments of the invention, the intrinsic polycrystalline semiconductor layer may be formed using, e.g., excimer laser annealing (ELA), solid phase crystallization, metal induced crystallization (MIC), metal induced lateral crystallization (MILC), and/or metal induced crystallization through a cap (MICC).

Figure 4:
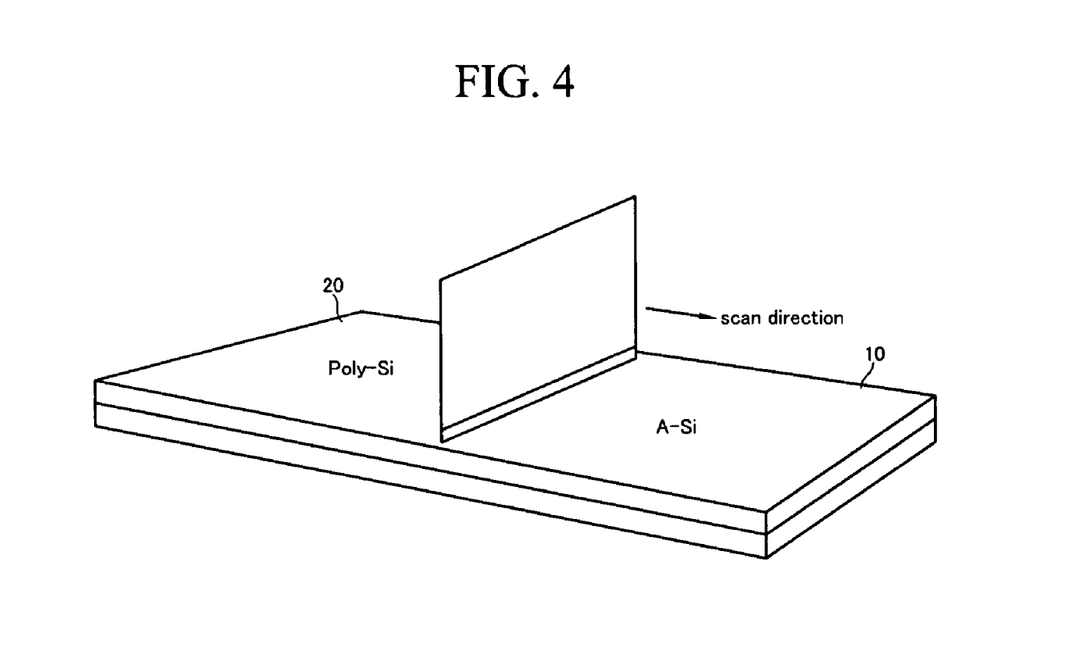
FIG. 4 illustrates a schematic diagram of a method of forming an intrinsic polycrystalline semiconductor layer using an ELA technique.

FIG. 4 illustrates a schematic diagram a method of forming an intrinsic polycrystalline semiconductor layer 20 using an ELA technique. As shown in FIG. 4, the ELA technique may perform crystallization by irradiating excimer laser onto amorphous silicon 10. The ELA technique may be implemented using a relatively simple process and the resulting intrinsic polycrystalline semiconductor layer 20 may have good current mobility.

Figure 5:
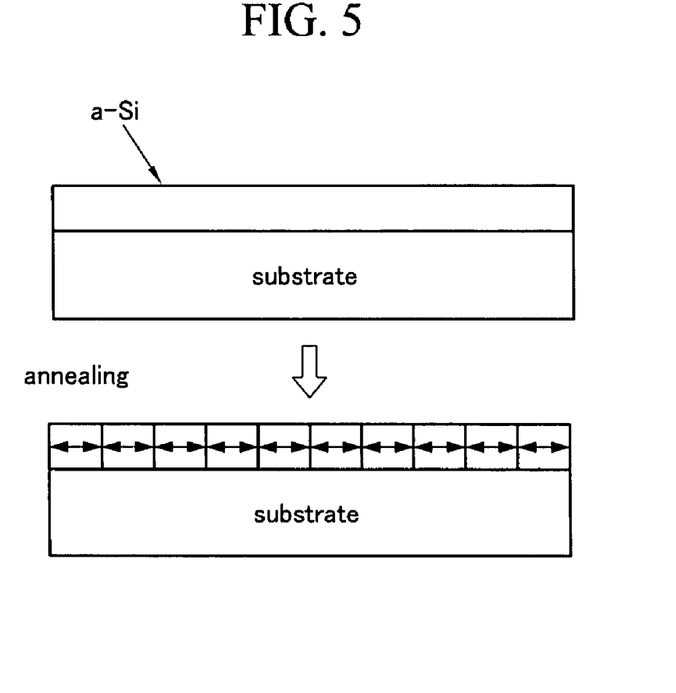
FIG. 5 illustrates a schematic diagram of a method of forming an intrinsic polycrystalline semiconductor layer using an SPC technique.

FIG. 5 illustrates a schematic diagram of a method of forming the intrinsic polycrystalline semiconductor layer 20 using an SPC technique. As shown in FIG. 5, the SPC technique may form the intrinsic polycrystalline semiconductor layer 20a by annealing the amorphous silicon 10 at a high temperature. The SPC technique may also be implemented using a relatively simple process and, as compared to the ELA technique, the resulting intrinsic polycrystalline semiconductor layer 20 made using the SPC technique may have a higher electron mobility.

Figure 6:
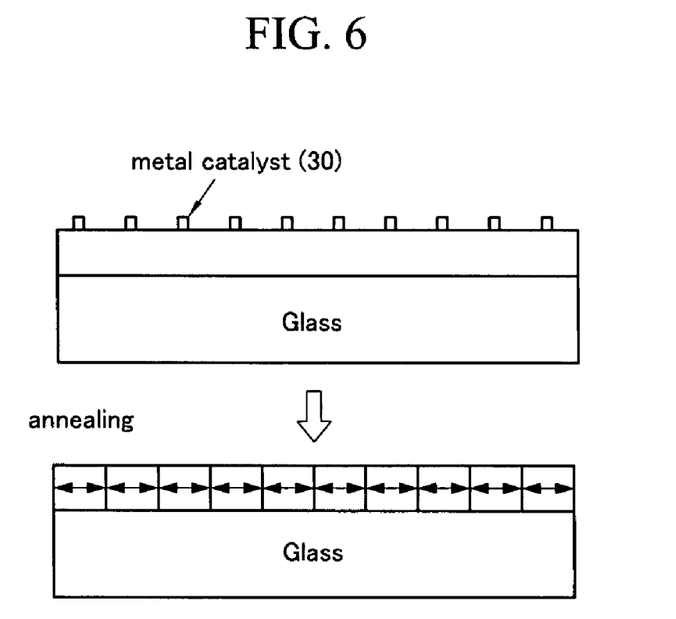
FIG. 6 illustrates a schematic diagram of a method of forming an intrinsic polycrystalline semiconductor layer using an MIC technique.

FIG. 6 illustrates a schematic diagram of a method of forming the intrinsic polycrystalline semiconductor layer 20 using an MIC technique. As shown in FIG. 6, the MIC technique may perform crystallization by applying a metal catalyst 30 onto the amorphous silicon 10 through sputtering or spin coating and then annealing the amorphous silicon 10 at a relatively low temperature. In some embodiments of the invention, the metal catalyst 30 may be made of, e.g., Ni, Pd, and Co, etc.

Figure 7:
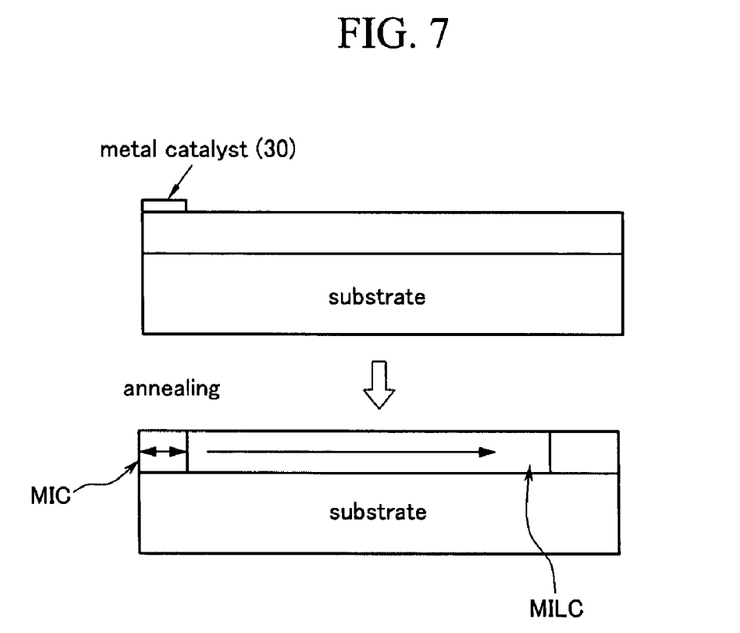
FIG. 7 illustrates a schematic diagram of a method of forming an intrinsic polycrystalline semiconductor layer using an MILC technique.

FIG. 7 illustrates a schematic diagram of a method of forming the intrinsic polycrystalline semiconductor layer 20 using an MILC technique. As shown in FIG. 7, the MILC technique may establish metal induced crystallization by depositing the metal catalyst 30 on source and drain regions, and laterally growing the crystallized seed into an activation region on the bottom of a gate.

Figure 8:
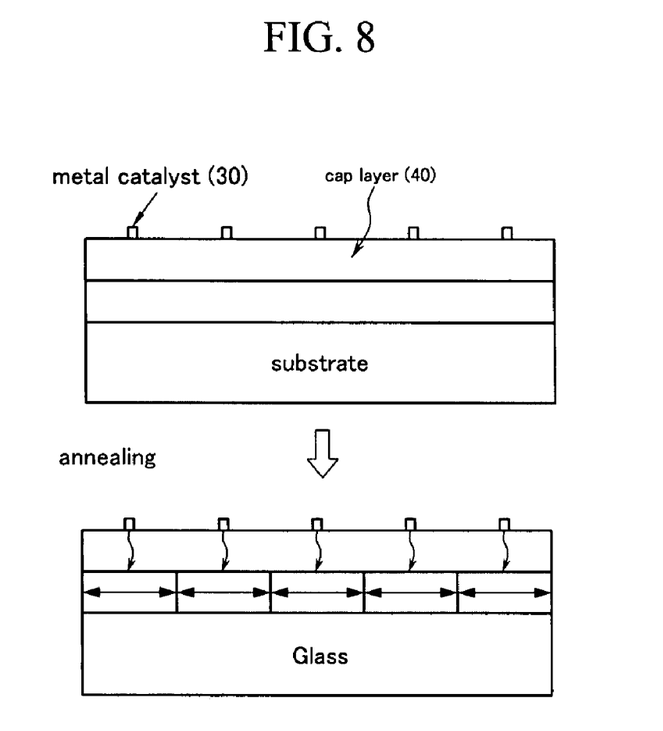
FIG. 8 illustrates a schematic diagram of a method of forming an intrinsic polycrystalline semiconductor layer using an MICC technique.

FIG. 8 illustrates a schematic diagram of a method of forming the intrinsic polycrystalline semiconductor layer 20 using an MICC technique. As shown in FIG. 8, the MICC technique may limit the size of metal catalyst 30 infiltrating into the semiconductor layer by forming an inorganic cap layer 40 between amorphous silicon 10 and the metal catalyst 30. The MICC technique may reduce contamination by the metal catalyst 30 and the resulting intrinsic polycrystalline semiconductor layer 20 may be made up of grains having a substantially or completely uniform size. In some embodiments of the invention, the inorganic cap layer 40 may be made of, e.g., silicon nitride ($SiN_x$) or silicon dioxide ($SiO_2$).

The intrinsic polycrystalline semiconductor layer 20 formed using, e.g., any of the aforementioned crystallization techniques may have superior characteristics, as compared to amorphous silicon. For example, the intrinsic polycrystalline semiconductor layer 20 may have better current mobility and/or reliability characteristics, as compared to amorphous silicon.

Figure 9:
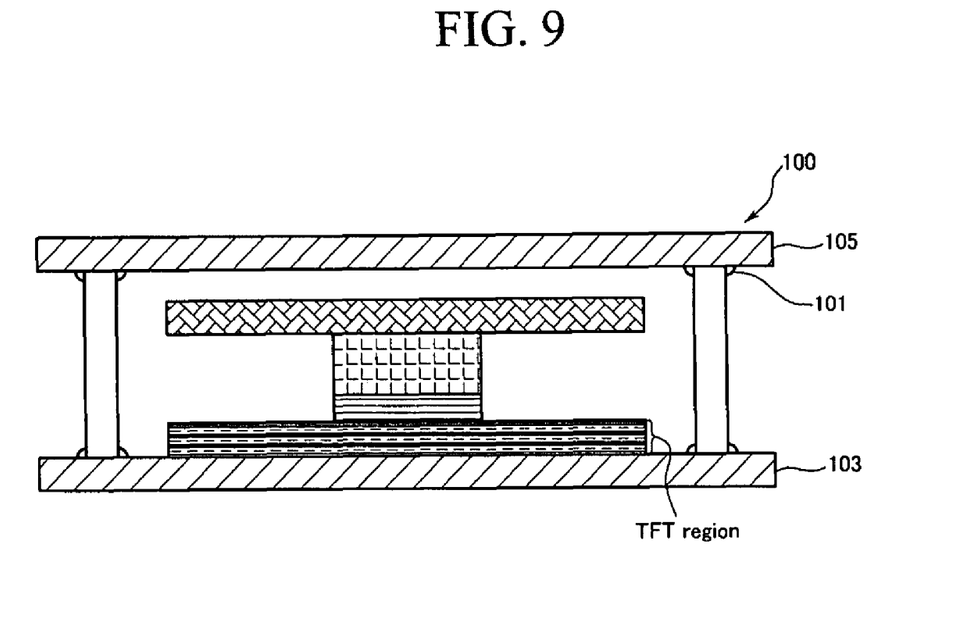
FIG. 9 illustrates a cross-sectional diagram of an exemplary OLED display including a first capacitive element employing an intrinsic polycrystalline semiconductor layer according to an exemplary embodiment of the present invention.

FIG. 9 illustrates a cross-sectional diagram of an exemplary OLED display 100 including a first capacitive element employing an intrinsic polycrystalline semiconductor layer according to an exemplary embodiment of the present invention. One or more pixels employing an intrinsic semiconductor as an electrode of a capacitive element thereof may be disposed between the lower substrate 103 and the upper substrate 105.

As shown in FIG. 9, the OLED display 100 may include a sealant 101 formed between a lower substrate 103 and an upper encapsulation substrate 105 in order to prevent the deterioration of characteristics as a result of, e.g., moisture and oxygen flowing inside. One or more pixels employing an intrinsic semiconductor as an electrode of a capacitive element thereof may be disposed between the lower substrate 103 and the upper substrate 105.

The sealant 101 may include, e.g., a moisture absorbent material that may absorb moisture and oxygen flowing inside.

The sealant 101 may be filled to maintain water-resistance and air-resistance on junctions or cracks, and may be made of an elastic material.

In some embodiments of the invention, e.g., the sealant 101 may include single component type material such as silicon-based (moisture-cure type) or acryl-based (dry-cure type) materials. Single component type materials may employ a mixture of a curing agent and a base polymer mixed together in advance to form a single component and packed into a container, e.g., a cartridge, in order to use instantly on the spot.

In other embodiments of the invention, e.g., the sealant 101 may include multiple component type materials including, e.g., modified silicon-based, polysulfide-based and/or polyurethane-based materials (reaction-cure type). Two component type materials may employ a curing agent and a base polymer, which are each packed in separate containers, e.g., cartridges, and then mixed together before use.

Figure 10:
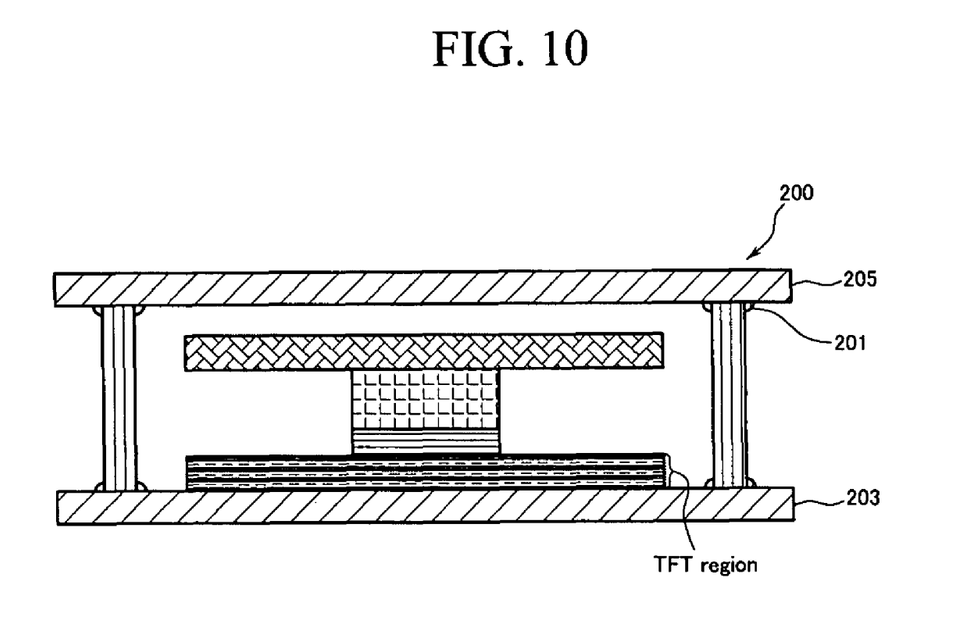
FIG. 10 illustrates a cross-sectional diagram of another exemplary OLED display including a first capacitive element that uses an intrinsic polycrystalline semiconductor layer according to another exemplary embodiment of the present invention.

FIG. 10 illustrates a cross-sectional diagram of another exemplary OLED display 200 including the first capacitive element employing an intrinsic polycrystalline semiconductor layer.

The OLED display 200 may be sealed with a frit 201. In some embodiments of the invention, the frit 201 may include, e.g., silicon oxide ($SiO_2$), a transition metal and/or a filler having low transition temperature (CTE). When the frit 201 material is irradiated, the frit 201 may soften and may form a bond, thereby forming a seal while avoiding thermal damage to the OLED display 200.

In some embodiments of the invention, the frit 201 may be formed by a laser frit sealing method that locally irradiates a laser at a low temperature to seal the space between lower and upper substrates 203, 205 of the OLED display 200. Such a method may minimize the thermal damage of an organic light emitting element included in the OLED display 200, and may prevent a contaminant from flowing inside the OLED display 200 through the formed seal. One or more pixels employing an intrinsic semiconductor as an electrode of a capacitive element thereof may be disposed between the lower substrate 203 and the upper substrate 205.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

As described above, embodiments of the invention may provide a pixel and/or an OLED display using the same that can reduce a cost and an amount of time associated with manufacturing a pixel employable by a display, e.g., OLED display, by employing a pixel having a capacitive element that employs an intrinsic semiconductor as one electrode thereof. Thus, a number of masks and/or processes required for manufacturing the pixel may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A pixel of a display device connected to a data line for supplying a data voltage to the pixel, a scan line for supplying a scan voltage to the pixel, a first power supply for supplying a first supply voltage to the pixel, a second power supply for supplying a second supply voltage to the pixel, and an initial voltage supply for supplying an initial voltage to the pixel, the pixel comprising:

a first transistor for supplying a current to a light emitting device;

a second transistor for diode-connecting the first transistor;

a third transistor having a first electrode connected to the data line and a second electrode connected to a first electrode of the first transistor;

a first capacitive element electrically connected to the first power supply and the initial voltage supply and including a first electrode that is an intrinsic semiconductor;

a fourth transistor having a first electrode electrically connected to the first capacitive element and a second electrode electrically connected to the initial voltage supply;

a fifth transistor having a first electrode connected to the first power supply and a second electrode electrically connected to a first electrode of the second transistor;

a sixth transistor having a first electrode electrically connected to the first electrode of the first transistor and a second electrode electrically connected to the first electrode of the light emitting device; and a second capacitive element electrically connected to a gate electrode of the third transistor and a gate electrode of the first transistor.

2. The pixel as claimed in claim 1, wherein the light emitting device is a light emitting diode.

3. The pixel as claimed in claim 1, wherein the light emitting device is an organic light emitting diode.

4. The pixel as claimed in claim 1, wherein the intrinsic semiconductor is an intrinsic polycrystalline semiconductor.

5. The pixel as claimed in claim 1, wherein the first transistor is a driving transistor.

6. The pixel as claimed in claim 1, wherein the first transistor is a P channel type transistor, and comprises a P-type semiconductor.

7. The pixel as claimed in claim 6, wherein impurities of the P-type semiconductor include at least one of antimony Sb, phosphorus P and arsenic As.

8. The pixel as claimed in claim 6, wherein a gate electrode of the sixth transistor is connected to an emission control line of the display.

9. The pixel as claimed in claim 8, wherein a gate electrode of the fifth transistor is connected to the emission control line, and applies the first supply voltage to a second electrode of the first transistor in response to a signal of the emission control line.

10. The pixel as claimed in claim 1, wherein the third transistor is a switching transistor and transfers the data voltage to the first electrode of the first transistor in response to the scan voltage.

11. The pixel as claimed in claim 1, wherein the second transistor is turned on in response to the scan voltage and when the second transistor is turned on, the first transistor is diode-connected.

12. The pixel as claimed in claim 1, wherein the scan voltage is applied to a gate electrode of the fourth transistor, and the fourth transistor applies the initial voltage to the first capacitive element in response to the scan voltage.

13. The pixel as claimed in claim 1, wherein the first electrode of the first capacitive element is a polycrystalline semiconductor crystallized by an excimer laser annealing (ELA) technique.

14. The pixel as claimed in claim 1, wherein the first electrode of the first capacitive element is a polycrystalline semiconductor crystallized by a solid phase crystallization (SPC) technique.

15. The pixel as claimed in claim 1, wherein the first electrode of the first capacitive element is a polycrystalline semiconductor crystallized by a metal induced crystallization (MIC) technique.

16. The pixel as claimed in claim 1, wherein the first electrode of the first capacitive element is a polycrystalline semiconductor crystallized by a metal induced lateral crystallization (MILC) technique.

17. The pixel as claimed in claim 1, wherein the first electrode of the first capacitive element is a polycrystalline semiconductor crystallized by a metal induced crystallization through a cap (MICC) technique.

18. An electroluminescent display including a first substrate and a second substrate spaced apart from the first substrate, wherein between the first substrate and the second substrate, the electroluminescent display comprises:

a data line for applying a data voltage;

a scan line for applying a scan voltage;

a first power supply for supplying a first voltage;

a second power supply for supplying a second voltage;

an initial voltage supply for supplying an initial voltage;

a first transistor for supplying a current to an electroluminescent device;

a second transistor for diode-connecting the first transistor;

a third transistor having a first electrode connected to the data line and a second electrode connected to a first electrode of the first transistor;

a first capacitive element electrically connected to the first power voltage supply and the initial voltage supply and including a first electrode that is an intrinsic semiconductor;

a fourth transistor having a first electrode electrically connected to the first capacitive element and a second electrode electrically connected to the initial voltage supply;

a fifth transistor having a first electrode connected to the first power supply and a second electrode electrically connected to a first electrode of the second transistor;

a sixth transistor having a first electrode electrically connected to the first electrode of the first transistor and a second electrode electrically connected to the first electrode of the electroluminescent device; and a second capacitive element electrically connected to a gate electrode of the third transistor and a gate electrode of the first transistor, wherein the space between the first substrate and the second substrate is sealed with at least one of a sealant including elastic material and a frit having silicon oxide ($SiO_2$).

19. The electroluminescent display as claimed in claim 18, wherein the electroluminescent device is an organic light emitting diode.

* * * * *